United States Patent
Sachdev et al.

(10) Patent No.: US 6,742,530 B2
(45) Date of Patent: Jun. 1, 2004

(54) SEMI-AQUEOUS SOLVENT CLEANING OF PASTE PROCESSING RESIDUE FROM SUBSTRATES

(75) Inventors: Krishna G. Sachdev, Hopewell Junction, NY (US); James N. Humenik, LaGrangeville, NY (US); Chon Cheong Lei, Poughkeepsie, NY (US); Glenn A. Pomerantz, Kerhonkson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/294,236

(22) Filed: Nov. 14, 2002

(65) Prior Publication Data

US 2003/0066540 A1 Apr. 10, 2003

Related U.S. Application Data

(62) Division of application No. 09/609,283, filed on Jun. 30, 2000.

(51) Int. Cl.[7] .............................. B08B 3/08; B08B 3/12
(52) U.S. Cl. ......................... 134/76; 134/105; 134/184
(58) Field of Search .................... 134/76, 105, 108, 134/184, 186, 111

(56) References Cited

U.S. PATENT DOCUMENTS

| | | | |
|---|---|---|---|
| 3,986,518 A | * 10/1976 | Sato .......................... 134/57 R |
| 4,736,760 A | * 4/1988 | Coberly et al. ............. 134/134 |
| 5,234,506 A | 8/1993 | Winston et al. ............... 134/40 |
| 5,264,047 A | 11/1993 | Winston et al. ............... 134/42 |
| 5,304,252 A | * 4/1994 | Condra et al. ................. 134/2 |
| 5,370,142 A | * 12/1994 | Nishi et al. .................... 134/61 |
| 5,437,808 A | 8/1995 | Weltman et al. ............ 252/170 |
| 5,486,314 A | * 1/1996 | Wack et al. ................ 510/163 |
| 5,538,024 A | * 7/1996 | Inada et al. ................... 134/60 |
| 5,610,132 A | 3/1997 | Momoda et al. ............ 510/506 |
| 5,786,319 A | 7/1998 | Pedersen et al. ............ 510/423 |
| 5,824,119 A | * 10/1998 | Takeuchi .................... 29/25.01 |
| 5,888,308 A | * 3/1999 | Sachdev et al. ............... 134/1 |
| 6,277,799 B1 | * 8/2001 | Sachdev et al. ............ 510/176 |
| 6,293,291 B1 | * 9/2001 | Sperlich et al. .......... 134/104.1 |
| 6,569,252 B1 | * 5/2003 | Sachdev et al. ............... 134/2 |
| 6,575,177 B1 | * 6/2003 | Brown et al. ................. 134/76 |

* cited by examiner

Primary Examiner—Frankie L. Stinson
Assistant Examiner—Saeed Chaudhry
(74) Attorney, Agent, or Firm—Margaret A. Pepper

(57) ABSTRACT

A process of cleaning of objects that relate to semiconductor fabrication processes, such as, for example, conductive paste screening in the production of multilayer ceramic substrates and composite solder paste by stencil printing in electronic circuit assembly. Specifically, the process removes a metal/polymer composite paste from screening masks and associated paste making and processing equipment used in printing conductive metal pattern onto ceramic green sheet in the fabrication of semiconductor packaging substrates. The process also cleans solder paste residue from stencil printing equipment used in electronic module assembly surface mount technology for SMT discretes, solder column attachment, and BGA (Ball Grid Array) attachment on ceramic chip carrier or for screening solder paste onto printed circuit board. More particularly, paste residue is cleaned from metal, ceramic, and plastic substrates by a non-alkaline semi-aqueous cleaning method employing high boiling propylene glycol alkyl ether or mixtures of propylene glycol alkyl ether and propylene glycol solvents.

4 Claims, 4 Drawing Sheets

Figure 2. Semi-Aqueous Solvent Cleaning with TPM

Figure 3. Semi-Aqueous Solvent Cleaning with TPM Reuse of Rinse Water

R-square = 0.991
y = 61.5 - 5.21(lnx)
x = exp((61.5 - y)/5.21)

R-square = 0.963
y = 64.5 - 5.07*(ln(x))
x = exp((64.5 - y)/5.07)

SEMI-AQUEOUS SOLVENT CLEANING OF PASTE PROCESSING RESIDUE FROM SUBSTRATES

RELATED APPLICATIONS

This application is a division of Ser. No. 09/609,283 now U.S. Pat. No. 8,569,252 filed Jun. 30, 2000.

FIELD OF THE INVENTION

The present invention relates generally to a new apparatus and method of semi-aqueous solvent cleaning of paste processing residue from substrates. More particularly, the invention encompasses an apparatus and a method that utilizes a semi-aqueous solvent cleaning method for cleaning of paste residue from screening objects comprising the use of at least one propylene-glycol alky-ether solvent.

BACKGROUND OF THE INVENTION

In the fabrication of multilayer ceramic (MLC) substrates for packaging semiconductor devices, conductive metal patterns are screened onto individual ceramic green sheets by printing, such as, extrusion printing, which uses metal mask, such as, Mo, Ni, or Cu, which are placed in contact with the green sheet, or by screen printing, which involves paste squeegee using mesh mask or emulsion mask. After screening, the green sheets are assembled and aligned, and laminated, followed by sintering operation to form multilayer ceramic substrate having internal metallurgy for mounting and interconnecting a plurality of integrated circuit semiconductor devices.

For advanced ground rule electronic packaging structures requiring to print closely spaced conductive metal patterns on a substrate, the screening masks used have highly dense fine dimension etched features. Under certain conditions such screening masks may have the problem of paste residue entrapment in the mask features in addition to a surface residue when the paste is screened to deposit conductive pattern on green sheets. This requires that the metal mask be cleaned after one or more screening passes to eliminate/minimize the possibility of defects in a subsequently screened pattern. Any defects in the screened paste pattern replicates into the final product causing yield loss.

Conductive pastes used in screening processes for delineation of wiring and/or via metallurgy, and I/O pad (input-output) patterns comprise metal particles dispersed in an organic binder and solvent vehicle along with wetting agents, dispersants/surfactants, plasticizers, and other additives, such as, thickening agents, antioxidants, and coloring agents which are all well known in the fabrication of electronic components.

Most commonly used conductive pastes in multilayer ceramic fabrication are based on molybdenum or tungsten metal powder dispersed in an organic polymer binder, such as, for example, ethyl cellulose, polymethyl methacrylate, and the like, or poly-hydrocarbon based thermoplastic resins dissolved in a high boiling solvent system.

Conductive pastes that are typically used for screening processes in multilayer ceramic comprise molybdenum, copper, tungsten, nickel, gold, tin, and the like. Because of the variety and complex chemical make-up of metal/polymer composite pastes, it is required that the mask cleaning medium and process selected be such that it provides complete and efficient cleaning of all types of pastes from screening masks and associated equipment, such as, extrusion heads or paste nozzles, etc.

Solder pastes commonly used in electronic assembly processes for interconnections constitute eutectic alloys, specifically, Pb—Sn, Bi—Sn, In—Sn, and related powder alloys dispersed in an organic carrier. Solder paste application onto substrates for component attachment is done by screen printing through a screen stencil, for example, stainless steel stencil, or by the dispense method. Various solder paste formulations constitute a eutectic alloy dispersed in an organic carrier, for example, a solvent, rheology modifier, fluxing agent, such as, rosin based flux. It is important to clean solder paste residue from metal mask stencils, especially in the case of ultra-fine pitch BGA (Ball Grid Array) attachment to assure defect-free printing on substrate metal pads and thus eliminate solder defects.

Traditionally used cleaning solvents for cleaning/degreasing purposes in many industrial and consumer product applications include aromatic hydrocarbons, chlorinated solvents, typically, 1,1,2-trichloroethylene, perchloroethylene, methylene chloride, and fluorochlorocarbons as CFC-113, and CFC-112. The chlorinated solvents were especially preferred because they are non-flammable, i.e., have no flash point, and are highly effective solvents.

Because of the environmental and health issues associated with the use halogenated hydrocarbon solvents in production processes, there has been major focus in the past decade to introduce environmentally safer/acceptable organic solvent alternatives, and water-based cleaning formulations. Recently, ultrasonic and spray cleaning equipment for water-based cleaning chemistry have become commercially available and several detergent compositions have been described in the patent literature for cleaning/degreasing purposes. These compositions are used, for example, for cleaning printed circuit board assemblies and other parts in device fabrication to remove soldering flux, oil/grease, and other organic residues invariably formed during bonding and assembly processes in microelectronics. These compositions are generally based on a combination of surfactants in water and/or alkaline detergent compositions, comprising alkali metal salts, such as, sodium metasilicate, sodium carbonate, tribasic sodium phosphate, sodium tripolyphosphate, and combinations thereof, as well as, highly alkaline solutions based on alkali metal salts, alkali metal hydroxides, and mixture thereof with alkanolamines. Aqueous cleaner formulations comprising this category of alkali metal carbonate and bicarbonate salts are utilized with an alkali metal silicate, as described in U.S. Pat. No. 5,234,506 (Winston), for the removal of solder flux, oils, waxes, and greasy substances, adhesives and other residues from electronic circuit assemblies, such as, printed circuit or printed wiring boards during their fabrication.

Alternate organic solvent cleaning methods are based on the use of low boiling alcohol, ketone, or ester solvents, for example, isopropyl alcohol (IPA), acetone, n-butylacetate, methyl ethyl ketone (MEK), and aromatic hydrocarbons, specifically xylene. These solvents have safety and environmental issues due to their low boiling points, high flammability, volatile emissions and VOC (Volatile Organic Compound) regulations, and thus are considered undesirable for production processes. Various aqueous cleaning alternatives designed for saponification mechanism, on the other hand, generally have a high pH (>11–13) detergent formulations. High pH aqueous cleaners have associated safety issues which require special handling and costly equipment designs to assure protection against any accidental contact exposure. With alkaline aqueous cleaners comprising alkali metal salts, for example, phosphates, silicates, hydroxides, and surface active agents, there is also an issue of wastewater management for compliance with the Clean Water Act regulations which require that all possible sources of aquatic toxicity and other environmentally undesirable constituents be removed from the effluent before discharge to surface waters. This requires special and costly wastewater treatments involving precipitation with complexing agents to form sludge that carries active ingredients of cleaning compositions, metals, and other dissolved constituents resulting in solids loading to the waste. To minimize waste and reduce cost with conservation of water in aqueous cleaning, there is currently significant industry direction toward environmentally suitable zero waste processes by devising methodology for reclamation, recycling, and reuse.

PURPOSES AND SUMMARY OF THE INVENTION

The invention is a novel method and an apparatus for semi-aqueous solvent cleaning of paste processing residue from substrates.

This invention basically is a semi-aqueous method of cleaning polymer/metal composite paste residue from screening masks/stencils and paste processing equipment in the production of multilayer ceramic substrates, organic chip carriers and cards, and of composite solder paste application in electronic circuit assembly. The method according to this invention involves a cleaning cycle using a high boiling, low vapor pressure, and substantially water soluble solvent, specifically, a propylene-glycol alkyl-ether solvent followed by a first water rinse to remove the cleaning solvent carry-over on the substrate from the cleaning tank, a second water dip/rinse (optional) to remove last traces of organic contaminants, if any, and then a final thorough water rinse and drying operation.

Therefore, one purpose of this invention is to provide an apparatus and a method that will help clean polymer/metal composite paste residue from a substrate.

Another purpose of this invention is to provide for a non-hazardous, low cost, cleaning option for paste residue from substrates.

Still another purpose of this invention is to have a semi-aqueous cleaning method for removing paste screening residue from screening equipment.

Yet another purpose of this invention is to provide a non-alkaline semi-aqueous water-based cleaning method for paste screening and paste processing equipment as a superior alternative to chlorinated solvents, volatile organic solvents and alkaline aqueous cleaning compositions in multilayer ceramic manufacturing and in microelectronic assembly processes.

Another purpose of this invention is to provide a semi-aqueous cleaning method for cleaning screens/stencils and paste processing parts by using high boiling propylene-glycol alkyl-ether solvents as a replacement of volatile organic solvents and aqueous alkaline cleaning to eliminate chemical safety concerns, volatile emissions and hazardous waste.

Yet another purpose of this invention is to provide a method for cleaning of paste residue from substrates using a high boiling organic solvent for the cleaning solvent without adding water or other additives such as surface active agents or other adjuvants such that the solvent can be easily recovered and recycled.

Still another purpose of this invention is to provide a semi-aqueous alternative to flammable solvents and aqueous alkaline cleaning compositions in cleaning screening paste residue and solder paste residue from substrates in microelectronic fabrication using a propylene-glycol alkyl-ether solvent that is effective in removing polar, non-polar, or hydrophilic and hydrophobic paste residue from metal and plastic surfaces.

It is also the purpose of this invention to provide a solvent-based semi-aqueous cleaning method for screening masks/stencils and paste processing equipment which does not require special wastewater treatment.

Yet another purpose of this invention is to provide a semi-aqueous cleaning method for paste screening masks which allows easy removal of washed-off metal by filtration and solvent recovery, for example, by distillation from the waste liquid and provides benefit of waste minimization.

Still another purpose of this invention is to provide a semi-aqueous cleaning method using a high boiling propylene-glycol alkyl-ether solvent that is compatible with metal masks, emulsion masks, electronic components and polymer adhesives used in assembly processes, and all contacting materials in the cleaning equipment.

Still yet another purpose of this invention is to provide a semi-aqueous cleaning method with an organic solvent which is non-flammable high boiling Class-III combustible, (flash point of greater than about 140° F.), preferably Class-UB combustible, (flash point of greater than about 200° F.), non-corrosive, and has no contact hazard concerns.

Therefore, the inventors are disclosing a first invention which comprises a semi-aqueous solvent cleaning method for cleaning of paste residue from at least one object comprising the use of at least one propylene-glycol alky-ether solvent.

The inventors are disclosing a second invention which comprises a method for cleaning paste residue from at least one object, comprising the steps of:
(a) Pre-heating propylene-glycol alkyl-ether solvent in a tank having at least one ultrasonic bath at between about 45 to about 80° C.,
(b) Immersing said paste residue carrying object in said preheated solvent and subjecting said object to ultrasonic agitation for between about 1 to about 10 min, and
(c) Transferring said object to a tank having preheated water at between about 45 to about 70° C., and subjecting said object to at least one immersion spray and/or ultrasonic agitation, and thereby cleaning said paste residue from said at least one object.

The inventors are disclosing a third invention which comprises an apparatus for cleaning paste residue from at least one object, comprising:
(a) at least one tank containing at least one pre-heated propylene-glycol alkyl-ether solvent in said tank, wherein temperature of said solvent in said is between about 45 to about 80° C., and wherein said tank further having at least one ultrasonic agitator,
(b) at least one means for immersing said paste residue carrying object in said pre-heated solvent and subjecting said object to ultrasonic agitation for between about 1 to about 10 min, and
(c) at least one means for transferring said object to a tank having preheated water at between about 45 to about 70° C., and subjecting said object to at least one immersion spray and/or ultrasonic agitation, and thereby cleaning said paste residue from said at least one object.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
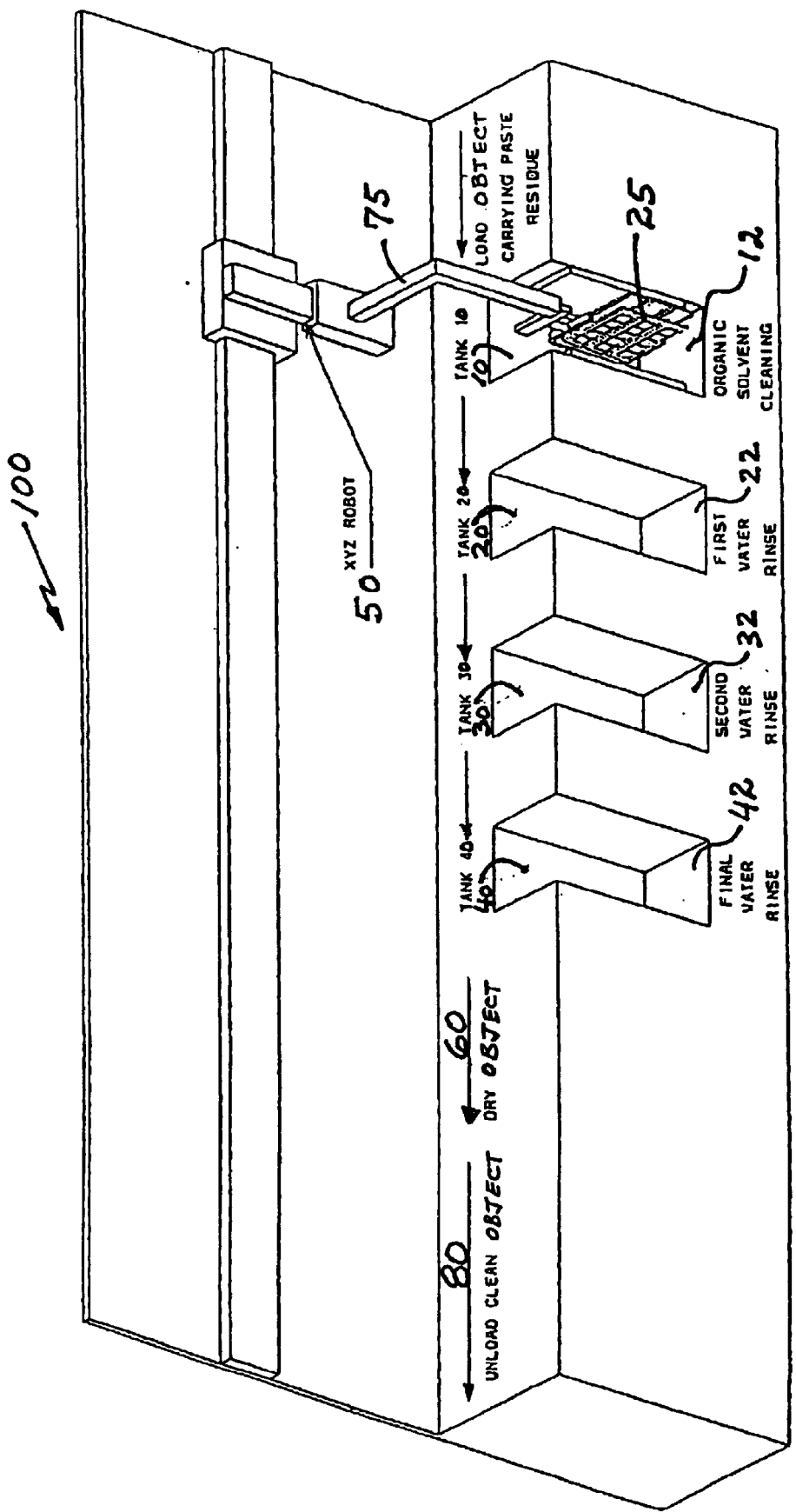
FIG. 1, is a representative drawing showing the apparatus assembly for the semi-aqueous cleaning process using this invention.

This invention relates to cleaning of objects that relate to semiconductor fabrication processes, such as, for example, conductive paste screening in the production of multilayer ceramic substrates or organic chip carriers and cards, and composite solder paste by stencil printing in electronic circuit assembly. This invention is concerned with removing, for example, a metal/polymer composite paste from screening masks and associated paste making and processing equipment used in printing conductive metal pattern onto ceramic green sheets in the fabrication of semiconductor packaging substrates. This invention is also concerned with the cleaning of solder paste from stencil printing equipment used in electronic module assembly, for example, in surface mount technology for SMT discretes as capacitors and resistors joining on chip carrier, solder column attachment, and BGA (Ball Grid Array) attachment on ceramic chip carrier or for screening solder paste onto printed circuit board. More particularly, this invention is concerned with cleaning of paste residue from metal, ceramic, and plastic substrates by a non-alkaline semi-aqueous cleaning method employing high boiling solvents which are partially or completely water soluble, particularly, propylene glycol alkyl ether solvents and thus can be rinsed off with water following the cleaning cycle.

Manufacture of semiconductor packaging products, such as, multilayer ceramic (MLC) substrates, typically employs the technique of conductive pattern screening on ceramic green sheet through a stencil mask using a variety of polymer-metal composite pastes to delineate a conductive pattern for the desired circuitry. In this process, some paste residue is left behind on the surface and inside the fine etched features of the mask. The residue entrapped in the mask features, and on the surface of the mask must be removed before the mask can be reused. This involves cleaning after one or more screening passes, depending on whether the paste is fast drying or slow drying, otherwise the paste residue can cause defects in a subsequently screened conductive pattern. A particular combination of a polar and/or non-polar polymer binder and solvent vehicle system selected for dispersing metal filler determines the solubility and wettability characteristics of the resulting paste which may range from hydrophilic to highly hydrophobic and which may be fast drying or slow drying.

Selection of conductive screening pastes that are based on a variety of polymer binder-solvent vehicle systems is dictated by several considerations, viz, requirement for a particular circuit pattern, drying characteristics of the paste, match of paste shrinkage with that of ceramic, and overall compatibility of the paste with green sheet materials for the necessary wettability and adhesion.

The screening masks used in the semiconductor industry are typically made of metal, such as, etched Mo mask, Cu/Ni electroform mask and emulsion masks for silk screening, such as, for example, stainless steel mesh with at least one photoresist coating of a suitable emulsion, such as, the polyacrylic-polyester based emulsion coatings.

The present invention provides a semi-aqueous cleaning method for mask cleaning with high boiling and partially or completely water soluble organic solvent, preferably, tripopyleneglycol methyl ether (TPM), as an environmentally safer, non-corrosive, and non-hazardous alternative to chlorinated solvents and flammable solvents, and high pH aqueous cleaners for effective cleaning of polymer/metal composite paste residue from screening equipment used in multilayer ceramic manufacturing, and solder paste residue on applicators used in component attachment for electronic circuit assembly.

The semi-aqueous cleaning method disclosed here employs completely or partially water soluble propyleneglycol alkyl-ethers, preferably without additives. This also has the special advantage of providing a non-corrosive, non-flammable and non-volatile solvent cleaning. Furthermore, the solvent, the rinse water, and the paste solids can easily be recovered and recycled, thus minimizing waste, reducing water consumption, eliminating the need for costly waste treatment, and providing an environmentally favorable industrial cleaning option and overall reduction in cost and waste.

Now referring to the figures, FIG. 1, illustrates the schematics of the cleaning apparatus assembly 100, and the sequence of process steps for practicing this invention. The cleaning apparatus assembly 100, basically comprises of at least one XYZ robot 50, having at least one robotic arm 75. The robotic arm 75, picks-up the object 25, to be cleaned from a loading area and moves it initially into a tank 10, having an organic cleaning solvent 12, of this invention. One could also have a plurality of cleaning tanks, e.g., tanks 20, 30, 40, containing cleaning fluids 22, 32, 42, respectively. The cleaning apparatus assembly 100, can also have a drying station 60, and an unload station 80, to unload the cleaned object 25, from the robotic arm 75.

After the robotic arm 75, picks-up the object 25, to be cleaned, such as, a substrate 25, having paste residue, the substrate 25, carrying paste residue is immersed in tank 10, which contains the cleaning solvent 12, preferably a dipropylene glycol methyl ether 12, or tripropylene glycol methyl ether 12, or a mixture thereof 12, which has been pre-heated at between about 45 to about 80° C., preferably, between about 50 to about 70° C., and equipped with ultrasonic or immersion spray or combination of ultrasonic and spray modes of agitation. The paste residue from the substrate 25, is removed by agitation in the solvent 12, for a predetermined time, preferably between about 1 to about 10 min, depending on the paste chemistry and the extent of residue deposit. The substrate 25, is then transferred to the tank 20, which contains water 22, preferably deionized water 22, and which is preferably preheated at between about 45 to about 70° C., to substantially remove the solvent carry-over from the cleaning tank (tank 10). The substrate 25, is then transported to tank 30, contains water 32, for a second (optional) water rinse to remove last traces of the organic solvent. The substrate 25, can then be subjected to a final thorough water rinse in tank 40, where the rinse water 42, can be drain discharged or recycled, as it is essentially free of any organic or inorganic contaminants. The cleaned and rinsed substrate 25, is finally dried at station 60, for example, by forced hot air or N2, and unloaded at station 80, for further processing.

Figure 2:
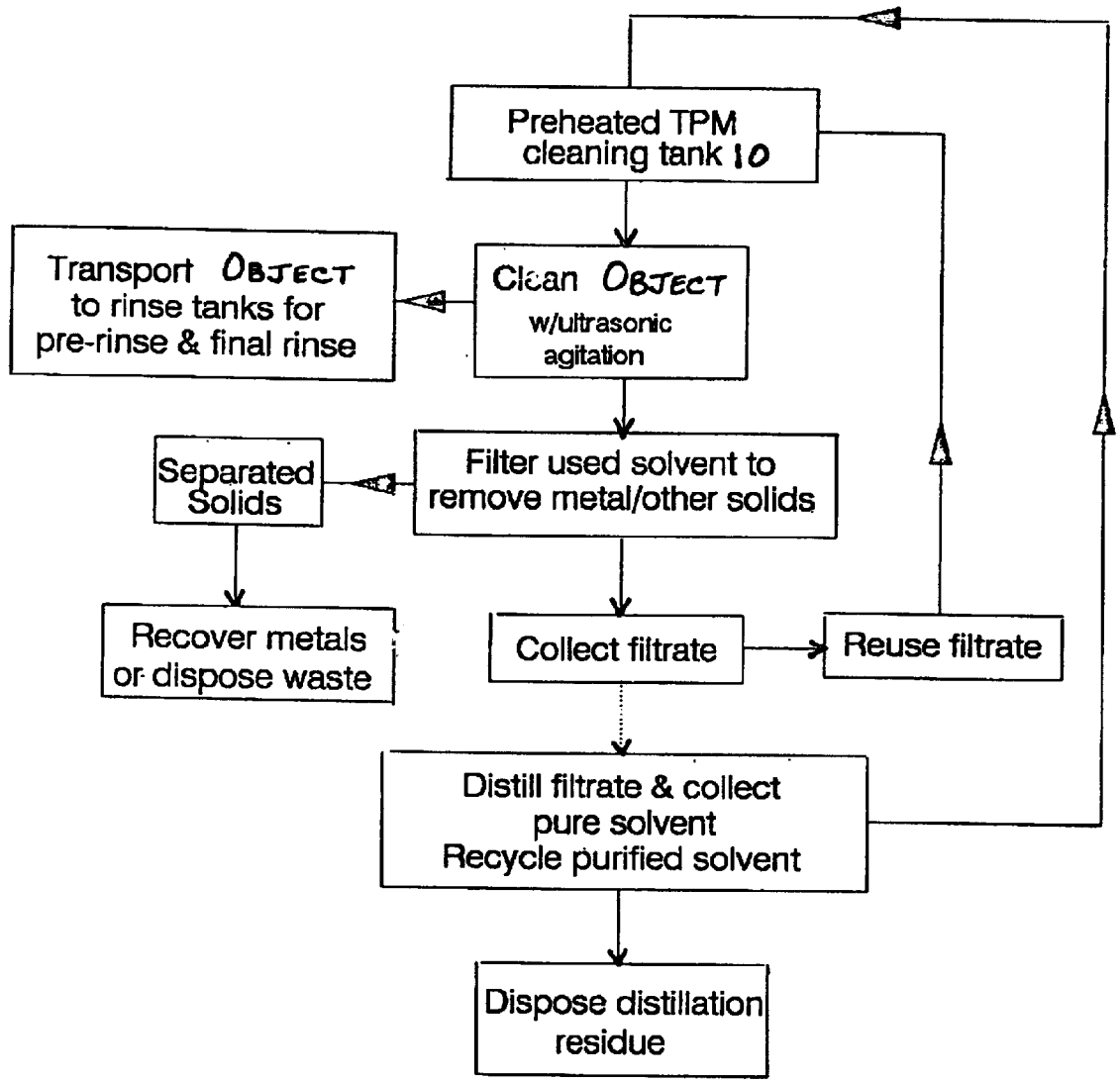
FIG. 2, is a block diagram showing one preferred mode of carrying out this invention.

FIG. 2, is a block diagram showing one preferred mode of carrying out this invention. In this embodiment of the invention, as illustrated in FIG. 2, the used solvent after cleaning paste residue from a single or multiple substrates, sequentially or in parallel with a di- or tri-propylene glycol alkyl ether, is filtered or centrifuged to remove washed-off paste solids which include metals, inorganics, and insoluble organic solvents. The filtrate can be reused for cleaning paste residue till the cleaning effectiveness remains essentially unaffected, and it is replaced with fresh solvent when the cleaning performance degrades. The solvent can also be recovered/reclaimed from the solids-free filtrate by distillation and the recovered pure solvent can be reused/recycled. However, the distillation residue can be disposed-off as waste. The metal solids collected by filtration or centrifugation can also be reclaimed by commonly knows methods or these can be disposed off.

The first water rinse (tank 20) can be used multiple times during which the carry-over solvent continues to build up, the relative concentration of carried-over solvent in water is monitored by periodic measurement of surface tension. The same rinse bath can be continued to be used until its surface tension reaches about 50 dynes/cm which corresponds to about 7% tri-propylene-glycol methyl-ether (TPM) in water.

Figure 4:
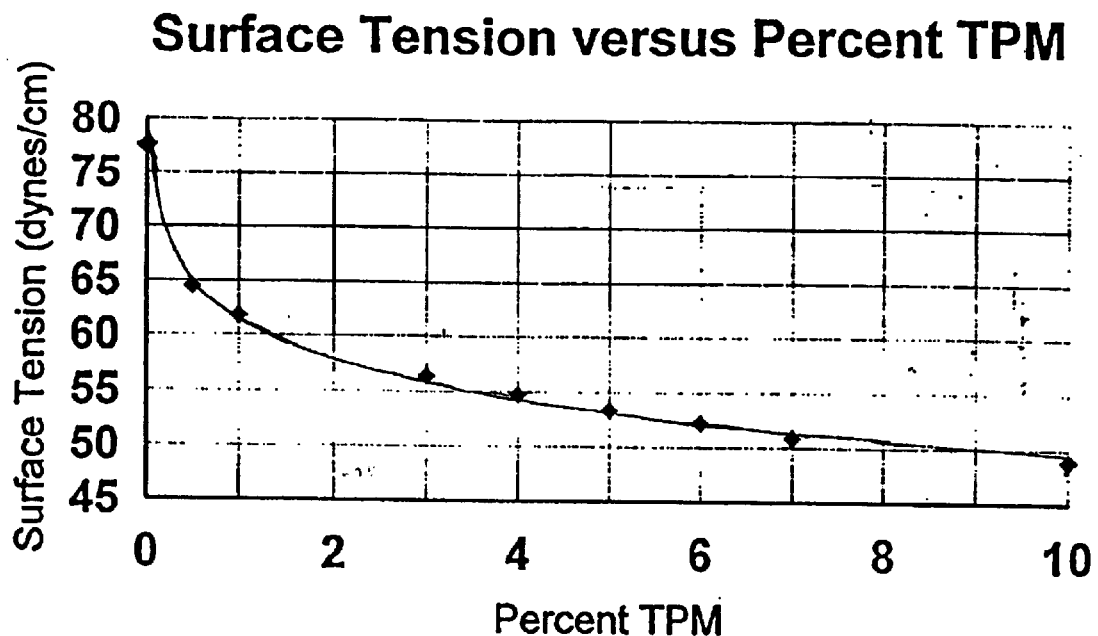
FIGS. 4 and 5, illustrate the calibration data in Tables 1 and 2, respectively, with graphical representation.
Figure 5:
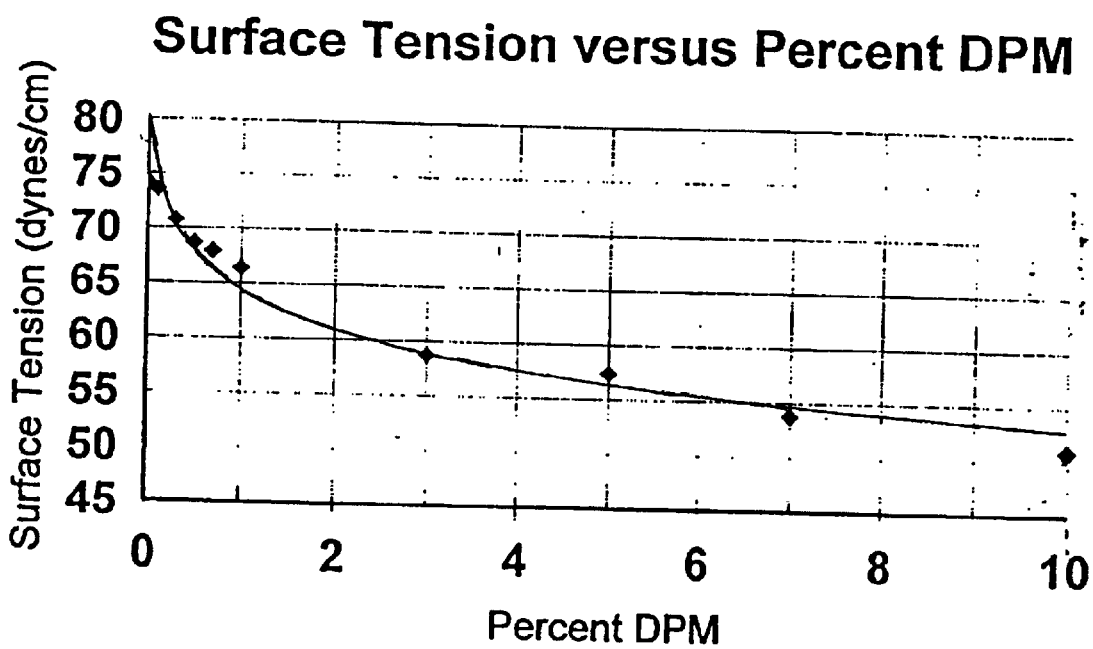

Table 1, shows the data for measured surface tension at known concentration for correlation of TPM concentration in water with surface tension of the mixture, and Table 2, shows similar correlation of DPM concentration in water with surface tension. FIGS. 4 and 5, are graphical representation of the data given in Tables 1 and 2, respectively. A second water rinse can optionally included to remove last traces of organic solvent, and finally the final thorough water rinse (tank 40) and hot air or $N_2$ dry. The final rinse water is essentially free of organic or inorganic impurities and thus can be drain discharged or can be reused as it would require no prior treatment.

Figure 3:
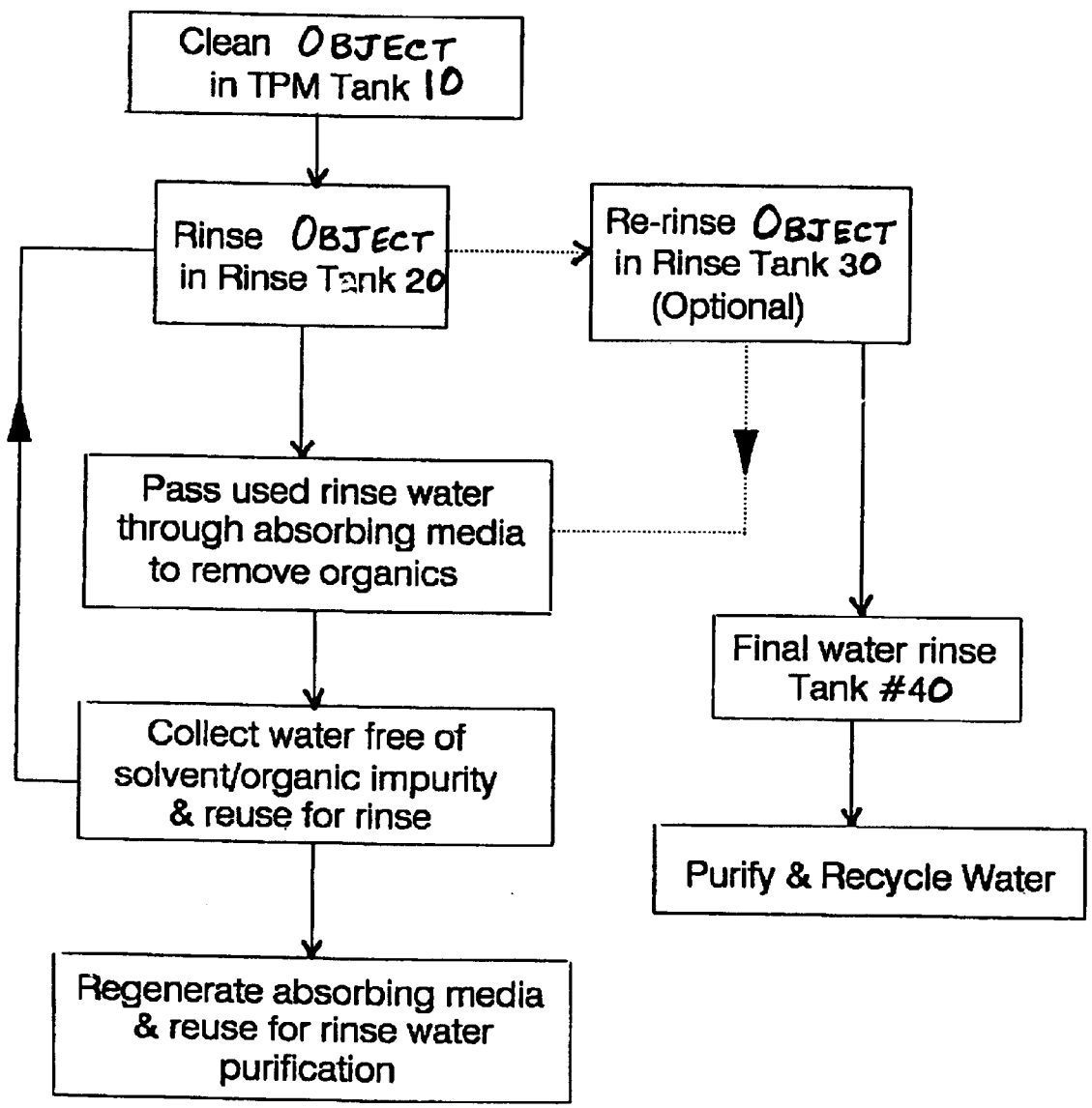
FIG. 3, is a block diagram showing another preferred mode of carrying out this invention.

FIG. 3, illustrates a block diagram showing another preferred mode of carrying out this invention. This mode of practicing the invention provides reduction in waste, reduced solvent consumption, reduced water consumption, and reduced material cost.

The first water rinse (tank 20) containing dissolved solvent due to solvent carry-over from tank 10, can also be gotten rid of organics by passing through an absorbing medium, for example, activated charcoal bed to remove organics and reused, or it can be separately disposed off in compliance with the wastewater disposal regulations for organic solvent contaminated water. This mode of practicing the invention has the benefit of further reducing waste and reducing material and process cost.

The primary application for this invention would be in the removal of paste residue from screening masks/stencils and ancillary equipment used in screening conductive paste patterns on ceramic green sheets in the manufacture of multilayer ceramic substrates and in cleaning solder paste applicators in electronic component assembly processes. This invention is particularly concerned with removing polymer/metal composite paste residue from paste screening or paste dispensing equipment using high boiling organic solvent, particularly, propylene glycol alkyl ethers, for example, tripropyleneglycol monomethylether (TPM), dipropyleneglycol monomethylether (DPM), and mixture thereof, and related materials to provide an environmentally favorable alternative to chlorinated solvents, and flammable solvents, and high pH aqueous alkaline cleaners.

Unlike high pH aqueous cleaning compositions, the semi-aqueous cleaning method according to this invention has no problem of corrosivity and contact hazard issues, and provides option for recovery and recycle of solvent as well as rinse water which can be reused. Semi-aqueous cleaning method using high boiling, partially or completely water soluble propylene-glycol alkyl-ether solvents according to this invention provides unique advantages of efficient removal of paste residue from metal and plastic substrates. This also allows easy recovery and recycling of the cleaning solvent and of rinse water, as well as reclamation of paste metals.

Basically, one could utilize any commercial cleaning equipment to carry out this invention. However, it is preferred that the equipment has ultrasonic cleaners with stainless steel tanks equipped with ultrasonic having frequencies between about 20 to about 40 kHz, and immersion spray modes with multi-tanks for separate cleaning, rinsing and drying steps. It is preferred that the equipment be equipped with re-circulation pumps, filter for continuous or intermittent removal of particulate, and ultra-filtration unit to allow reuse of the cleaning solvent, as well as, a water treatment systems, such that both the cleaning medium and the rinse water can be recycled.

This invention also provides an improved method to remove conductive paste residue from screening equipment in the production of multilayer ceramic (MLC), and solder paste applicators used in component attachment/interconnections for module assembly. The screening pastes used in MLC for defining via and wiring metallurgy pattern on ceramic green sheet and are comprised of metal filler of the type, molybdenum, copper, tungsten, nickel, gold, silver, some of which may also contain inorganic fillers as glass, ceramic powder, or glass frit, dispersed in an organic polymer binder and a high boiling organic solvent vehicle along with other necessary additives which include sufactants/dispersants, coloring agents, thickening agents or rheology modifiers, and antioxidants etc. Representative polymer binder systems in conductive paste formulations for multilayer ceramic include: cellulosic polymers such as ethyl cellulose, cellulose acetate butyrate, alkyl methacrylate polymers such as poly(methyl methacrylate), poly(ethyl methacrylate), hydrocarbon polymers based thermoplastic resins which are all hydrophobic, or the binder can be hydrophilic such as hydroxy ethyl cellulose, hydroxypropyl cellulose, hydroxymethyl cellulose, and the like.

High boiling solvent vehicles having low evaporation rates that are preferred for polymer/filler conductive paste dispersions include ester-alcohol or glycol-ether type solvents such as 2,2,4-trimethylpentane diol, 1,3, monoisobutyrate (Texanol), diethylene glycol monomethylether acetate, diethylene glycol monobutylether acetate or butyl carbitol acetate (BCA), and the like. Generally, the solid component in screenable pastes comprises 70–85 percent (wt. %) metal filler, 1–5 percent of organic polymer binder and other organic additives, and the balance constituting the solvent vehicle system. Depending on a particular binder-solvent system used in paste formulation, the paste can be polar or non-polar, hydrophilic or oleophilic, having differences in affinity and adhesive characteristics for the mask surface in addition to having differences in drying rate.

According to this invention, it has been found that polymer/metal composite paste residue left on screening masks and paste making and dispensing equipment in the process of conductive pattern screening on green sheet can be readily removed with partially or completely water soluble di- or tri-propylene-glycol alkyl-ethers by ultrasonic agitation at between about 45 to about 70° C., followed by a first water rinse to remove the carried-over solvent, an optional second water rinse, and the final water rinse, and finally drying the cleaned substrate according to the standard practice. The first water rinse can be simply a brief dip, during which the solvent displacement by water can be aided by mechanical agitation, for example, stirring, ultrasonic agitation, or spray. A similar method of cleaning is found effective for removing solder paste residue from paste applicators in component attachment in circuit assembly, for example, stainless steel stencils and dispensing equipment. In one embodiment of this invention, Mo metal masks or metal electroform masks, carrying conductive paste residue from a screening pass are submerged in an ultrasonic bath containing tripropylene glycol methyl ether (TPM) at between about 50 to about 70° C., and ultrasonics turned-on for between about 1 to about 5 min., when the residue is essentially completely washed off from the mask surface as well as from the fine etched features.

Subsequent to paste removal with TPM, masks are raised above the liquid to allow solvent drip for a few seconds, and then immediately transferred to the adjacent water rinse tank, preferably equipped for some form of agitation for few seconds, then an optional second water rinse for a few seconds to remove any residual solvent, followed by the final spray or ultrasonic rinse with copious amount of water and finally drying with forced air, preferably hot air or $N_2$. In another embodiment of this invention, paste residue from screening and paste application equipment can be removed by spray cleaning using single nozzle or multi-nozzle spray gun but the ultrasonic cleaning is a preferred mode of cleaning with according to this invention due to solvent mist issues with organic solvent spray mode. The semi-aqueous method of cleaning disclosed herein effectively and efficiently removes all types of paste residues that may include polar, non-polar, hydrophilic, and hydrophobic type of screening and solder pastes from masks/stencils, typically Mo metal masks, metal electroform masks, stainless steel screens, and emulsion masks, solder paste applicators, which is free of environmental and safety issues, with no problem of metal corrosion, contact hazard, and flammability.

Representative candidates in propylene-glycol alkyl-ether category that can be used in the semi-aqueous cleaning method according to this invention are illustrated by the following chemistry:

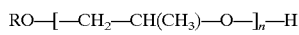

where:
- R=$CH_3$, n=2: Dipropyleneglycol methylether(DPM),
- R=$CH_3$, n=3: Tripropyleneglycol methylether (TPM),
- R=$C_2H_5$, n=2 or 3: Di- or Tripropyleneglycol ethylether,
- R=$C_3H_7$, n=2 or 3: Di- or Tripropyleneglycol isopropylether,
- R=$C_4H_9$, n=2: Dipropyleneglycol n-butylether (DPnB),
- R=$C_4H_9$, n=3: Tripropyleneglycol n-butylether (TPnB),
- R=Methyl, n=x: Polypropyleneglycol methylether (PPM), and
- R=n-Butyl, n=x: Polypropyleneglycol butylether.

These can be used as single solvents, solvent blends with propylene-glycol alkyl-ether and/or propylene-glycol solvents, for example, dipropylene glycol, tripropylene glycol, and mixtures thereof, and in combination with surfactants including ionic, non-ionic, amphoteric surfactants, or combinations thereof, such that the cleaning solvent or a mixture of solvents still remains water soluble and this can be completely rinsed off during the water rinse cycle.

Among these candidates, the methyl-ether solvents, DPM and TPM are essentially completely water soluble while the isopropyl ether solvents are sparingly soluble and the DPnB and TPnB are essentially insoluble in water. It is found that a single solvent, for example, DPM or TPM or mixture thereof, without any surface tension lowering additives are effective in cleaning paste residue on screening masks and paste processing equipment used in ceramic substrate production and in electronic circuit assembly. For removing highly hydrophobic paste residue from metal and plastic surfaces, tripropylene glycol butyl ether (TPnB) or dipropylene glycol butyl ether (DPnB) can be blended with TPM up to 20% by volume, and optionally adding a surfactant, was found effective when processed according to the semi-aqueous cleaning method according to this invention.

Tri-propylene-glycol methyl-ether (TPM) is a preferred organic solvent for the semi-aqueous cleaning method disclosed herein for polymer/metal composite paste residue removal but other related commonly known propylene glycol alkyl ethers that may also be used: di-propylene-glycol methyl-ether (DPM), tri-propylene-glycol butyl-ether (TPnB) or other propylene-glycol alkyl-ether solvents in combination with TPM so long as the mixed solvent system remains readily rinsable with water.

According to the preferred embodiments of this invention, the propylene-glycol alkyl-ether solvent used in the semi-aqueous has the following essential characteristics:
- Surface tension is less than about 40 dynes/cm
- Non-corrosive, no contact hazard concerns
- High boiling with flash point, above about 140° F.
- Low VOC (Volatile Organic Compound) potential
- Non-ODS (Ozone Depleting substance)
- Partially or completely soluble in water
- No detrimental effect on metal and plastic parts
- Compatible with solvent recovery and recycling
- Option for reclamation of paste metal solids
- Suitable for production or laboratory operations
- Can be used in conjunction with surfactants/additives.

Tripropyleneglycol (TPM), a preferred solvent, has the following relevant physical properties:
Boiling point of about 243° C.; Flash point of about 121° C. (250° F.); and vapor pressure of about 25° C. at about 0.01 mm Hg.

The overall process involves ultrasonic or pressure spray cleaning of paste residue carrying substrates with a propylene glycol alkyl ether solvent which is followed by the first water rinse to replace the solvent on the surface of substrate with water, an optional second water rinse to remove any residual solvent, and then the final water rinse and hot air dry operations to provide clean and dry substrates for use in subsequent screening cycle. Cleaning Solvent bath life, i.e., number of cleaning cycles in the same liquid bath before solvent replacement depends on the frequency of use, type and number of parts being cleaned in one cycle and the total amount of paste residue removed per cycle.

The waste solvent from the cleaning process described herein contains soluble and insoluble paste constituents primarily metal and inorganic solids and dissolved paste organics. It has been found that the metal and inorganic solids in the wash separate out in a readily filtrable form which can be removed by filtration or by first centrifuging followed by filtration. The filtered solvent contains dissolved organic constituents of the paste residue removed along with dissolved metals. As shown in FIG. 2, the solids-free solvent can be micro-filtered or passed through absorbing media, for example, activated charcoal, and reused at least once again to clean paste residue from screening masks and paste processing equipment. Alternatively, the waste solvent after solids removal can be subjected to distillation to recover essentially pure solvent which can be reused for cleaning, thus providing waste minimization, and material cost reduction.

The rinse water from the first rinse operation contains varying level of the cleaning solvent due to its carry-over from the cleaning bath, the relative wt % of which e.g., TPM, can be obtained by monitoring the surface tension which decreases as the amount of the solvent carry-over increases, for example, as TPM increases as shown in the calibration data in Tables 1 and 2, with graphical representation in FIGS. 4 and 5, respectively. It is found that the first water rinse bath can be continued to be used till the surface tension comes down to about 50 dynes/cm which corresponds to about 7 wt % TPM (calculated from the surface-tension/TPM concentration correlation shown in FIG. 4.) dissolved in water at which time, the used rinse water is replaced by fresh water. The semi-aqueous cleaning method for paste residue removal disclosed herein offers a major benefit such that it presents no safety issues, no corrosion and contact hazard concerns, relatively easy recycling of solvent because no or minimum amount of other additives, and rinse water, and thus allows reduced consumption of organic solvent, waste minimization, economic benefit, and water conservation. With the recycling of cleaning solvent and rinse water after purification, the semi-aqueous cleaning method disclosed herein has the potential for a close-loop system where the cleaning solvent as well as the rinse water are recovered and recycled. This is in contrast to cleaning with chlorinated solvents in addition to the environmentally hazardous volatile emission issues, the solids are disposed-off as hazardous waste which goes for landfill or it is incinerated.

TABLE 1

| Percent DPM in Water | Surface Tension (dynes/cm) |
| --- | --- |
| 0 | 77.6 |
| 0.5 | 64.5 |
| 1 | 61.8 |
| 3 | 56.4 |
| 4 | 54.8 |
| 5 | 53.4 |
| 6 | 52.3 |
| 7 | 50.9 |
| 10 | 48.9 |
| Pure TPM | 32.5 |

TABLE 2

| Percent DPM in Water | Surface Tension (dynes/cm) |
| --- | --- |
| 0 | 75.9 |
| 0.1 | 73.5 |
| 0.3 | 70.8 |
| 0.5 | 68.7 |
| 1 | 66.5 |

TABLE 2-continued

| Percent DPM in Water | Surface Tension (dynes/cm) |
| --- | --- |
| 3 | 58.8 |
| 5 | 57.4 |
| 7 | 53.8 |
| 10 | 50.9 |
| PureDPM | 32.1 |

The mask cleaning method using TPM and related solvents also has several advantages over the multi-component aqueous alkaline solutions of prior art comprising alkali metal silicates, phosphates, and surfactants. Specifically, such ingredients in the commonly known aqueous detergent compositions have environmental issues, require costly, waste generating sludge forming wastewater treatment, and are not compatible with recovery from the effluent. These methods require the use of coagulants and flocculants, typically lime precipitation as Alum and iron salts, or PACls (polyaluminum chloride), organic poly-electrolytes etc, to precipitate silicates, phosphates, and other suspended matter from wastewater which adds to solids loading of the waste. The 'sludge' or precipitated solids has associated disposal issues of landfill limitation, disposal cost, and if there is any heavy metal contamination, it becomes hazardous waste requiring higher cost of waste disposal.

Representative applications of the disclosed method are in the area of ceramic manufacturing, conductive paste screening, solder paste stencil printing for SMT, ultra fine pitch BGA, assembly solder paste applicators, and thermal paste cleaning.

The propylene-glycol alkyl-ether solvent of this invention would be a direct replacement of chlorinated hydrocarbon solvents, such as, perchloroethylene, aromatic hydrocarbon solvents, such as, xylene, and alcohol and ketone solvents, such as, methanol, ethanol, isopropanol, methyl ethyl ketone.

As stated earlier this invention allows the cleaning of screening masks and associated equipment by a semi-aqueous cleaning method employing a high boiling, low vapor pressure, substantially water soluble organic solvent to remove conductive paste residue in ceramic substrate manufacturing technology.

Similarly, this invention teaches the cleaning of paste residues in electronic circuit assembly, for example, solder paste stencil printing, solder paste application/dispensing for SMT, and ultra fine pitch BGA assembly, with a semi-aqueous cleaning method employing a high boiling, low vapor pressure, substantially water soluble organic solvent to remove conductive paste residue from solder paste applicators.

EXAMPLE

Various aspects of the present invention are further illustrated by referring to the following example which is intended only to further illustrate the invention and is not intended to limit the scope of the invention in any manner.

Example 1

Molybdenum metal masks having fine pitch etched features for via and wiring metallurgical patterns, and for I/O pads, suitable for multi-layer ceramic substrates were used for screening conductive pastes onto ceramic green sheet with a paste screening tool. Various conductive pastes used for screening in ceramic technology generally comprise of metal filler as the predominant component in a polymer binder-solvent system. Representative pastes screened onto green sheets using the metal masks contained between about 70 to about 85 percent metal powder filler, typically Molybdenum, Copper, Tungsten, and Nickel, in ethyl cellulose type polymer binders and a high boiling polar solvents, for example, 2,2,4-trimethylpentane diol 1,3-monoisobutyrate, or diethylene glycol alkyl ether acetate in conjunction with fatty acid ester based surfactant, thickening agents, and other additives like antioxidants, coloring agents, corrosion inhibitors, etc. Also tested were non-polar conductive pastes based on low molecular weight thermoplastic resins derived from petroleum hydrocarbons as the binder in place of cellulosic binders in combination with hydrocarbon oil as solvent vehicle. Some of the pastes tested, in addition to carrying metal powder as the major component also contained inorganic fillers such as glass, ceramic, $Al_2O_3$—$SiO_2$ glass-frit. After the paste screening operation, the masks carrying the paste residue on the surface and inside the etched features were cleaned with tripropyleneglycol monomethylether (TPM) as described in the following examples:

Example (A)

The solvent 12, was preheated to between about 55 to about 65° C. in the first ultrasonic tank 10, of the apparatus assembly 100, shown in FIG. 1, and the mask 25, mounted on a special handler 50, was submerged in the solvent 12, with XYZ robotic arm 75. Ultrasonics were then turned on for between about 2 and about 3 min or until the paste residue was removed from all areas of the mask 25. After the solvent cleaning, the mask 25, was transported to tank 20 (FIG. 1) for first water rinse 22, preferably de-ionized water 22, with ultrasonic on or other means of mechanical agitation to accelerate the carry-over solvent displacement with water. Optionally, the mask 25, is then transported to the second rinse tank (tank 30), followed by final water rinse 42, in tank 40, and dry by forced hot air or $N_2$, at station 60. Microscopic inspection of the cleaned masks 25, showed no evidence of paste residue in any area of the masks 25.

Example (B)

Similar process as discussed in Example 1, was used for cleaning screening paste residue from paste applicators and other processing parts/equipment 25, which required up to between about 5 to about 10 min ultrasonic agitation for complete removal of the paste from all areas. The cleaning process could be accelerated by using ultrasonic with immersion pressure spray with single or multi-nozzle systems, followed by water rinse and drying cycles and described in Example 1(A). Microscopic inspection of cleaned and dried parts 25, showed no evidence of paste residue in any area of the parts 25.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for cleaning a conductive or soldering paste residue from at least one object selected from the group consisting of screening mask, paste processing parts used in the production of ceramic substrates or plastic substrates, screen stencils, stencil printing equipment, paste dispense substrate, ceramic substrate and plastic substrate, the apparatus comprising:
    (a) at least one first tank containing a solvent consisting of at least one dipropylene glycol alkyl ether and at least one tripropylene glycol alkyl ether, wherein temperature of said solvent in said first tank is between about 45 to about 80° C., said first tank further having at least one ultrasonic agitator,
    (b) at least one second tank having preheated water at between about 45 to about 70° C., and
    (c) at least one means for handling said object, so as to immerse said object in said first tank and subject said object to ultrasonic agitation for between about 1 to about 10 mm, and transfer said object from said first tank to said second tank and subject said object to at least one of immersion array and ultrasonic agitation.

2. The apparatus of claim 1, further comprising at least one third tank, and wherein said means for handling said object includes means for transferring said object from said second tank to said third tank and subjecting said object to at least one of spray rinse and ultrasonic agitation for between about 30 sec to about 120 sec.

3. The apparatus of claim 1, further comprising at least one filter for removing particulate matter from said solvent.

4. The apparatus of claim 1, further comprising means for distilling said solvent to recover said solvent for reuse.

* * * * *